United States Patent [19]

Richardson et al.

[11] Patent Number: 5,577,091
[45] Date of Patent: Nov. 19, 1996

[54] WATER LASER PLASMA X-RAY POINT SOURCES

[75] Inventors: Martin Richardson, Oviedo; Masataka Kado, Orlando; Kai Gabel, Orlando; Feng Jin, Orlando, all of Fla.

[73] Assignee: University of Central Florida, Orlando, Fla.

[21] Appl. No.: 372,297

[22] Filed: Jan. 13, 1995

Related U.S. Application Data

[63] Continuation-in-part of Ser. No. 222,608, Apr. 1, 1994, Pat. No. 5,459,771.

[51] Int. Cl.$^6$ .................................................. H05G 2/00
[52] U.S. Cl. ........................................ 378/119; 378/143
[58] Field of Search .................................... 378/119, 143

[56] References Cited

U.S. PATENT DOCUMENTS

| | | | |
|---|---|---|---|
| 4,700,371 | 10/1987 | Forsyth et al. | 378/34 |
| 4,723,262 | 2/1988 | Noda et al. | 378/119 |
| 4,866,517 | 9/1989 | Mochizuki et al. | 378/119 |
| 5,126,755 | 6/1992 | Sharpe et al. | 346/75 |
| 5,142,297 | 8/1992 | Eijkman et al. | 346/1.1 |
| 5,151,928 | 9/1992 | Hirose | 378/119 |
| 5,459,771 | 10/1995 | Richardson et al. | 378/119 |

FOREIGN PATENT DOCUMENTS

| | | | |
|---|---|---|---|
| 0158842 | 9/1983 | Japan | 378/119 |
| 0267895 | 11/1990 | Japan | 378/119 |

OTHER PUBLICATIONS

Mochizuki et al., Soft X–ray Optics & Tech., Proccedings of SPIE vol. 733, Dec. 1986, pp. 23–27.

Silfvast et al. Laser-produced plasma for soft s-ray projection lithography, J. Vac. Sci. Technol. Nov. 1992, pp. 3126-3133.

Richardson et al. Laser plasma sources for soft x-ray projection lithography, SPIE vol. 1848, Nov. 1992, pp. 483-500.

Jine et al., Mass limited laser plasma cryogenic target for 23nm point x-ray sources for lithography, SPIE vol. 2015, Aug. 1993, pp. 1-9.

Richardson et al., Characterization and control of laser plasma flux parameters for soft-x-ray projection lithography, Applied Optics vol. 32, No. 34, Dec. 1993, pp. 6901-6910.

*Primary Examiner*—David P. Porta
*Assistant Examiner*—David Vernon Bruce
*Attorney, Agent, or Firm*—Brian S. Steinberger

[57] ABSTRACT

A high repetition-rate laser plasma target source system wherein ice crystals are irradiated by a laser and lithography system. The target source system comprises in a preferred embodiment a liquid tank source and freezer means which freezes microscopic particles into crystal shapes which are projected by a nozzle jet from a high repetition rate liquid-droplet injector into the path of a flashing laser beam, which results in producing soft x-rays of approximately 11.7 nm and 13 nm. Uncollected and unshot target crystals are collected and reliquified by a heater source in order to be recycled back to the liquid tank source. Optionally an auxiliary source and detector system can be used to allow for instantaneous triggering of the laser beam. The target source system can be incorporated into well known EUV lithography systems for the production of wafer chips.

14 Claims, 6 Drawing Sheets

Fig. 2b
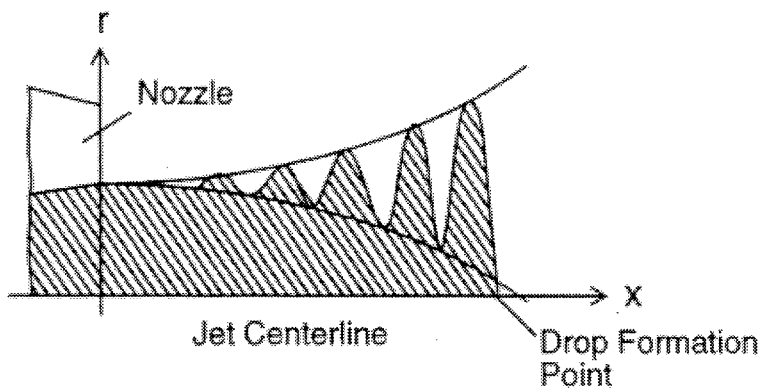
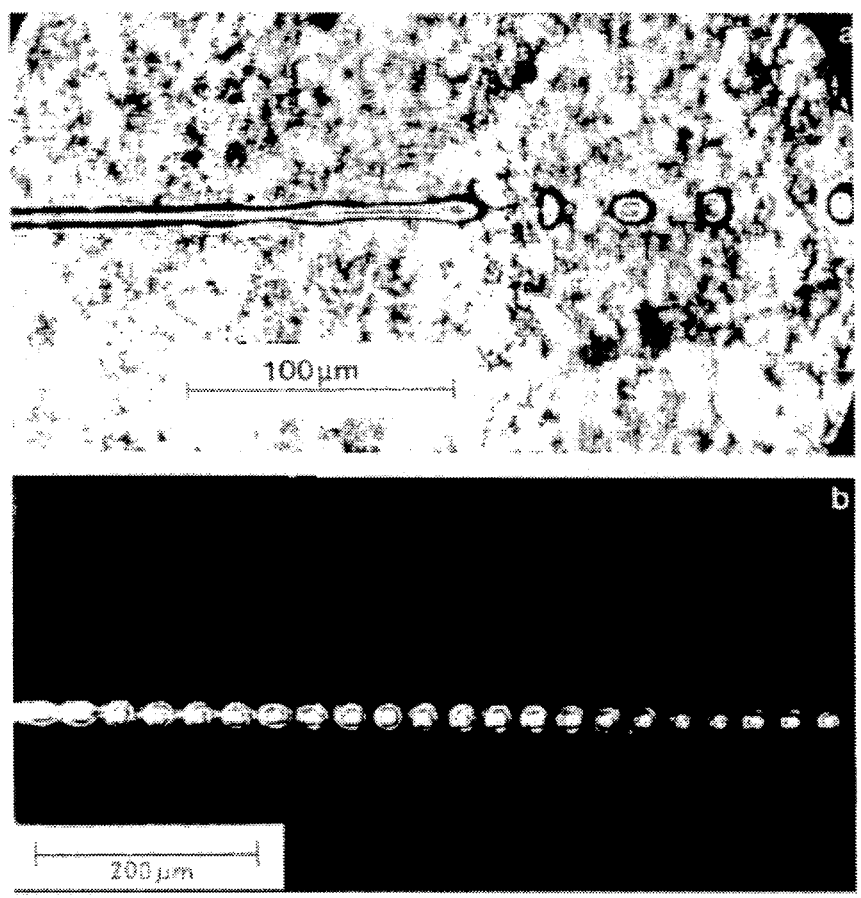
Fig. 2c

WATER LASER PLASMA X-RAY POINT SOURCES

This invention is a continuation-in-part of patent application Ser. No.: 08/222,608 filed on Apr. 1, 1994, and now U.S. Pat. No. 5,459,771. This invention relates to lasers, and in particular to an ice water target source for laser plasma soft-x-ray or EUV projection lithography.

BACKGROUND AND PRIOR ART

For soft x-ray or EUV projection lithography them is a need for a high repetition-rate laser plasma source that can radiate at a specific wavelengths in the EUV part of the spectrum and capable of operating at approximately 1200 Hz. The wavelength of the EUV radiation must correspond to the peak reflectivity of the precision multi-layer coated reflective optics utilized in this approach. At the present time the wavelengths of choice are 13 nm and 11.7 nm, but in the future other wavelengths may be preferable. This type of source should comprise a compact high repetition-rate laser and a renewable target system capable of operating for prolonged periods of time. For a production line facility, there would need to be uninterrupted system operation for periods of approximately 3 months. That is, uninterrupted operation for some $10^9$ shots. To make the irradiation system cost effective, current system cost scenarios indicate the unit shot material cost must be in the vicinity of $\$10^{-6}$ per shot. Target sources for laser plasma soft-x-ray projection lithography have encompassed several systems such as tape driven targets and solid targets and frozen gases which all have inherent problems.

U.S. Pat. No. 5,151,928 to Hirose discloses a system which uses film type tapes as a target source. However, tape driven targets are limited mass targets that are difficult to construct, prone to breakage and produce low velocity debris that can damage the other components such as the mirrors in the laser output system. Furthermore, using and replacing the tapes is generally cumbersome and costly.

Solid targets also have many problems. Known solid target sources include rotating solid wheels of Sn or tin, or copper or gold or other materials. These sources inherently can produce various ballistic particles types that can emanate from the plasma in various directions. When using tin as the target, the interaction of the laser light with the plasma, causes highly stripped, energetic ions to be formed by collision ionization. These ions can stream ballistically from the plasma region with velocities of between $10^6$ and $10^7$ centimeters per second. Furthermore, after the interaction of the plasma and the tin target, hot clumps or clusters of target material are boiled off of the target. These material has been determined to be another form of debris particles that can have velocities in the range of 200 to 2500 centimeters per second. The sizes of these particles range from less than 1 to greater than 200 micrometers. These larger particles can cause cold particle cratering on many of the components used to construct visible and x-ray optical components such as the mirrors and are capable of puncturing thin-film x-ray filters. All of these debris size particles can degrade the surface quality or the operating performance by overcoating the optical elements in the laser output system. Likewise, other solid targets besides tin can produce similar debris type particles.

Frozen gasses such as Krypton, Xenon, and Argon have also been tried as laser source targets, and also have problems. Besides the exorbitant cost required for containment costs, these gasses are also quite expensive and would be difficult to have a continuous high repetition rate that would cost significantly greater than $\$10^{-6}$. Moreover, all embodiments of frozen gas targets have envisaged massive (continuous) large-mass pellets targets which produce particulate debris.

SUMMARY OF THE INVENTION

The first objective of the present invention is to provide an inexpensive, continuously sequencing target system as a laser plasma x-ray source.

The second object of this invention is to provide a target system that produces nondamaging debris for a laser plasma x-ray source.

The third object of this invention is to provide a laser plasma target source capable of producing x-rays in the EUV and x-ray region in spectral lines of specific wavelength and bandwidth.

The fourth object of this invention is to provide a laser plasma target source that can operate at a frequency of approximately 1000 Hz to 100 kHz.

The fifth object of this invention is to provide a laser plasma target source that can operate continuously.

The sixth object of this invention is to generate a narrow band EUV and soft x-ray radiation source.

In a preferred embodiment, the target source system comprises a liquid tank source and freezer means which freezes microscopic particles into crystal shaped droplets which are projected by a nozzle jet on a high repetition rate liquid-droplet injector into the path of a flashing laser beam, which results in producing soft x-rays. Uncollected and unshot target crystals are collected and reliquified by a heater source in order to be recycled back to the liquid tank source. Optionally an auxiliary source and detector system can be used for instantaneous triggering of the laser beam.

Further objects and advantages of this invention will be apparent from the following detailed description of a presently preferred embodiment which is illustrated schematically in the accompanying drawings.

BRIEF DESCRIPTION OF THE FIGURES

FIG. 2b shows the formation of droplets produced by the apparatus of FIG. 2a.

FIG. 2c shows the droplets of FIG. 2b in flight.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1:
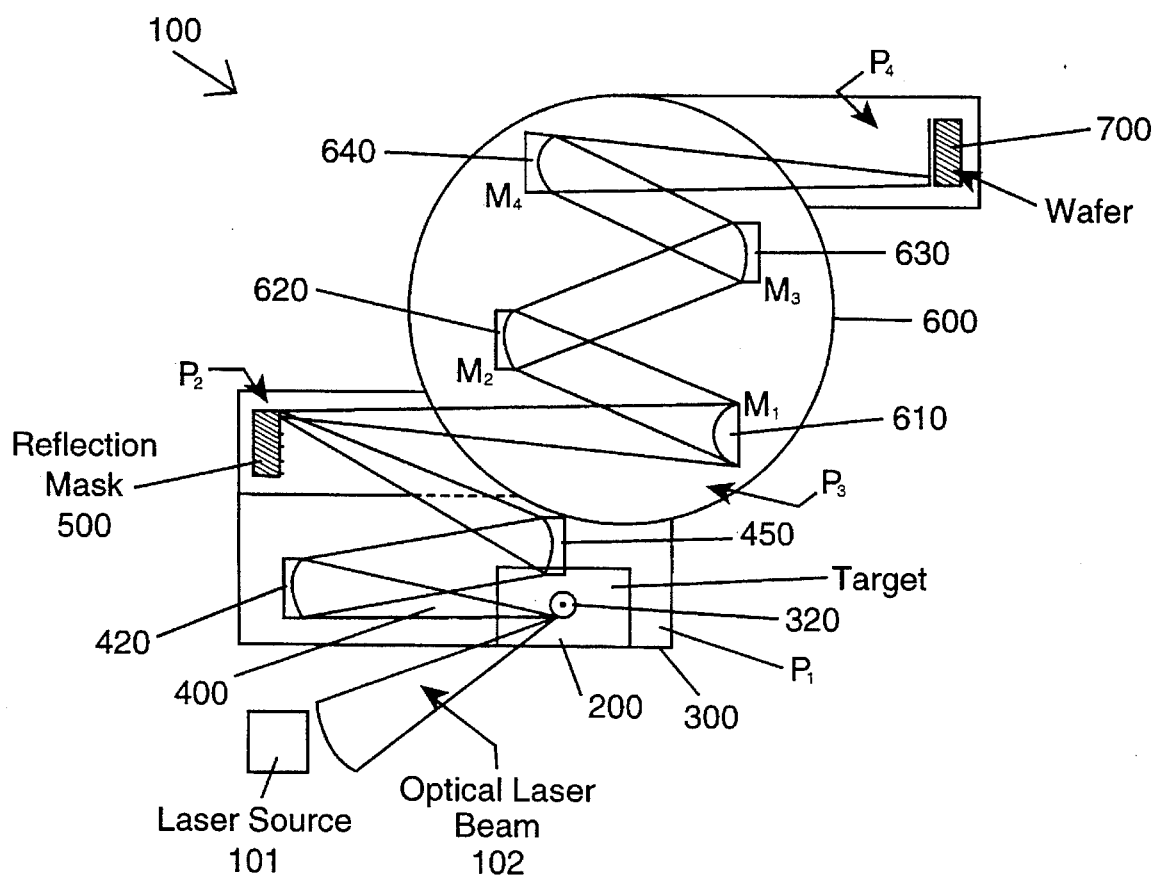
FIG. 1 illustrates the EUV Lithography system using the water laser x-ray plasma source.

FIG. 1 illustrates an overview of an EUV Lithography system 100 that uses the water laser x-ray plasma source 300 which will be discussed later in reference to FIG. 2. The components of the EUV Lithography system 100 will now be discussed. The laser beam source 101 used to irradiate the EUV target can be a high repetition rate Nd:Yag or KrF examer laser. 200 indicates the vacuum enclosure for the laser plasma target. Element 300 refers to the apparatus that continuously creates replenishable target material 320 for each laser shot, such as ice droplets. Element 420 is a first EUV collector mirror which can be spherical in overall shape or have a spherical surface. The surface of this mirror can be coated with special multilayer structures to provide high reflectivity at near-normal incidence at selected EUV wavelengths such as 11.7 nm, 13 nm, and so on. Element 450 is a second multilayered coated EUV collector mirror. Although not shown, alternatively a third or more multilayered coated EUV collector mirrors can be incorporated in the FIG. 1 system. 500 refers to a specially fabricated mask structure having reflecting surfaces comprising a structure patteRN to be imaged onto the wafer 700. Elements 610, 620, 630 and 640 refer to various other spherical reflective components well known to be used in an optical system of high precision that are capable of imaging reflection mask 500 to wafer 700. Elements 610, 620, 630 and 640 can further be coated with multilayer EUV normal incidence coatings for preselected wavelengths to be used in the system. Enclosure 600 denotes a separate vacuum enclosure for housing components 610, 620, 630 and 640 of the imaging system. Alternatively, enclosure 600 can contain a low background gas such as He. Finally element 700 is a lithographic wafer comprising an EUV sensitive resist on a semiconductor substrate.

In operation an optical laser beam 102 is emitted from source 101 striking target 320. Radiation 400 in the form of x-rays from the laser plasma source generated from target 300 are collected at mirror 420 and subsequently focussed via mirrors 450 onto mask 500 which subsequently reflects a preselected pattern via mirrors 610 to 640 to wafer 700.

Figure 2A:
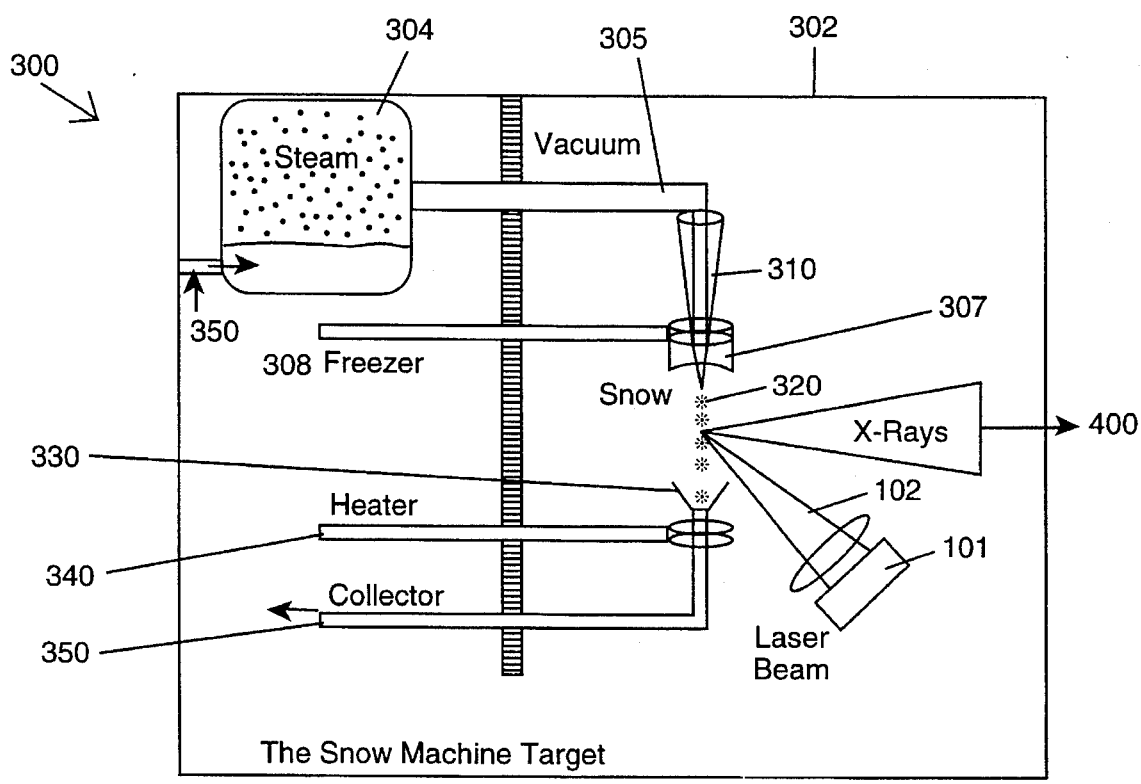
FIG. 2a shows a preferred embodiment of the apparatus used as the laser target source in FIG. 1.

FIG. 2a shows a preferred embodiment of the apparatus 300 used to create the continuously replenishable target material used as the laser target 320 in FIG. 1. A source supply of basic laser target material such as a pressurized water tank 304 can supply water to injector 310 either as a continuous stream of water under pressure, or as a vapor or steam that is subsequently frozen by freezer means 308. The components of apparatus 300 can be housed in a vacuum enclosure 302. Means 308 freezes the steam from tube 305 into frozen pellets 320 of ice crystals or snow. These frozen pellets of ice can be formed by passing the droplets through a single metallic tube 307 that has been thermo-electrically cooled or chilled by liquid Nitrogen having an approximate temperature of minus 77 degrees centigrade. Alternatively, element 307 can comprise concentric metallic tubes where the area between the inner and outer tubes includes cold liquid helium of approximately minus 260 degrees centigrade. An additional freezing technique can be accomplished by the inherent freezing that can take place within the vacuum chamber 302. In the latter technique small droplets of water injected into a vacuum will freeze due to rapid evaporation from the surface of the droplet. Under this technique approximately 10% of the mass of a 100 ngm water droplet will be lost to evaporation before the droplet freezes.

Element 310 of FIG. 2a represents a nozzle jet device for projecting crystals into the path of laser beam 102. High repetition rate liquid-droplet injectors with nozzle jets such as those described in U.S. Pat. Nos. 5,126,755 and 5,142,297 which are incorporated by reference can be utilized to project the frozen water droplets 320. Although these patents describe specific embodiments of ink jet systems, the laser plasma target system disclosed in this application can utilize any type of ink jet type droplet injectors, so long as the droplet size can be made to approximate 50 to 200 ngm in mass.

The mass of the droplet is determined by the required soft x-ray or EUV radiation. For example, in a 10 mJ requirement of x-ray energy at ($\lambda$) of 13 mm ($\Delta\lambda$=0.3 mm), the number of photons needed are:

$$N = \frac{\text{x-ray energy in joules}}{\text{energy per photon in joules}} = \frac{Ex}{hc/\lambda}$$

where; $h$(Planck's constant) = $6.626 \times 10^{-34}$, and $c$(velocity of light) = $3 \times 10^8$ m/s)

$$N = \frac{10 \times 10^{-3}}{((6.626 \times 10^{-34})*(3 \times 10^8))/(13 \times 10^{-9})}$$

$N = 6.5 \times 10^{14}$

For $\lambda$ = 11.6 nm, $N$ = $5.8 \times 10^{14}$.

Assume only 1% of the total ions radiate into this bandwidth for high Z (such as Sn) broadband radiation and 10% for low Z(such as oxygen) narroz band radiation and each individual ions radiates only once during the course of a laser pulse. Then the minimum number of ions required for the desired x-ray energy is about:

$6.5 \times 10^{14}/1\% = 6.5 \times 10^{16}$ for high Z target
and
$6.5 \times 10^{14}/10\% = 6.5 \times 10^{15}$ for low Z target Using low Z(Oxygen) composed in $H_2O$ as target material and assuming each $H_2O$ molecule could contribute one oxygen atom, the number of $H_2O$ molecules required is therefore $6.5 \times 10^{15}$. These molecules have a weight of approximately 200 ng and occupy a volume of about $0.2 \times 10^{-3}$ mm$^3$, a spherical volume of about 70 μm in diameter.

Water droplet systems using piezo-electric vibration systems such as those described in U.S. Pat. Nos. 5,126,755 and 5,142,297, can produce a continuous jet of water bubbles of diameter in the range of 50 to 200 ngm. FIG. 2b shows the principle of the drop formation process. FIG. 2b shows photographs of the formation of the droplets and of the droplets in flight.

Referring to FIG. 2a, element 330 signifies a vacuum collector system for absorbing unused or unshot targets. An optional heater system 340 can reliquify unused or unshot targets that can be recycled through collector tube 350. Unused targets will liquify on contact with the collector 330. Enhanced liquification can be introduced by heating the collector with an optional heating coil element 340. A pump within line 350 will suck the unused liquid to reservoir tank 304 or alternatively to a waste site.

The operation of apparatus 300 will now be discussed in reference to FIG. 2a. Source tank 304 creates steam that feeds through line 305 and becomes frozen by freezer means 308. Alternatively, the vacuum space within chamber 302 can inherently cause the steam to freeze into crystal forms such as those having a snow flake shape. Nozzle jet 310 projects microparticle ice crystals 320 at a rate of up to 1 MHz into the path of flashing laser beam 102 which flashes at a rate of approximately 200 Hz to 100,000 Hz. Collector system 330 which is in the path of crystals 320 collects the unused and unshot target crystals. Heater 340 reliquifies the crystals in order that the crystals can be recycled and pumped through line 350 back to tank source 304.

Figure 3:
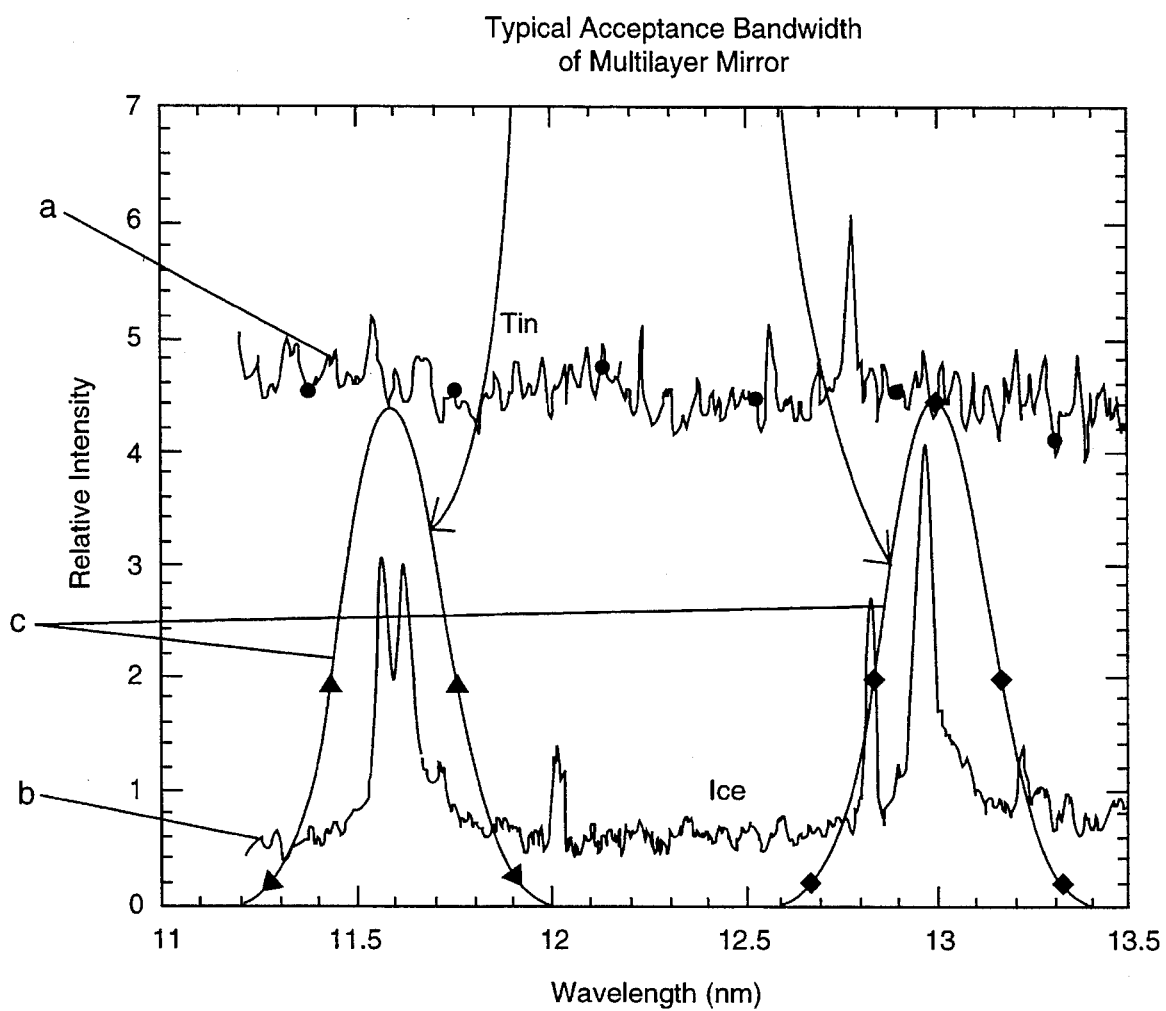
FIG. 3 shows comparative x-ray spectroscopic data from laser plasma targets.

FIG. 3 shows comparative x-ray spectroscopic data from laser plasma targets. Two spectra are shown. One is of the typical radiance of an ice target laser plasma compared to the emission of conventional target plasma. Superimposed on the spectra of the conventional target(from a Sn target) is an example of the reflectivity of typical EUV mirrors as a function of EUV radiation wavelength. Line "a" shows a typical radiation at a wavelength from 11 to 13.5 nm that comes from materials such as Sn, An, Cu, W, Xe, or Kr as laser target sources. Line "b" shows the narrow line emission emanating at wavelengths of 11.7 and 13 nm from using an ice target such as the crystal particle droplets 320 shown in FIG. 2a.

These are not the only spectral lines that emanate from an oxygen(water) target. Table I indicates the wavelengths and transition probabilities(relative amplitude or emission efficiency) of all spectral lines emanating from He-like and Li-like ions of oxygen in the wavelength range 81 Å (81.1 nm) to 132 Å (13.2 nm).

TABLE 1

| He-like and LI-like oxygen transitions | | | | |
|---|---|---|---|---|
| ION | WL | TRANS | PROB | F |
| HE | 81.498 | 6D-2P | 1.36E + 10 | 0.014 |
| HE | 84.436 | 6D-2P | 1.19E + 10 | 0.013 |
| HE | 86.114 | 5D-2P | 1.86E + 10 | 0.021 |
| HE | 86.114 | 5D-2P | 2.48E + 10 | 0.028 |
| HE | 86.114 | 5D-2P | 1.38E + 10 | 0.015 |
| HE | 86.206 | 5P-2S | 1.18E + 10 | 0.013 |
| HE | 89.398 | 5D-2P | 2.19E + 10 | 0.026 |
| HE | 91.093 | 4P-2S | 2.36E + 10 | 0.029 |
| HE | 91.093 | 4P-2S | 2.36E + 10 | 0.029 |
| HE | 91.093 | 4P-2S | 2.36E + 10 | 0.029 |
| HE | 96.139 | 4D-2P | 5.35E + 10 | 0.074 |
| HE | 96.139 | 4D-2P | 2.23E + 10 | 0.031 |
| HE | 96.139 | 4D-2P | 1.34E + 10 | 0.019 |
| HE | 96.139 | 4D-2P | 2.97E + 10 | 0.041 |
| HE | 96.139 | 4D-2P | 4.01E + 10 | 0.056 |
| HE | 96.197 | 4P-2S | 2.27E + 10 | 0.032 |
| HE | 100.24 | 4D-2P | 4.81E + 10 | 0.073 |
| HE | 120.34 | 3P-2S | 5.28E + 10 | 0.115 |
| HE | 120.34 | 3P-2S | 5.28E + 10 | 0.115 |
| HE | 120.34 | 3P-2S | 5.28E + 10 | 0.115 |
| HE | 128.25 | 3P-2S | 5.10E + 10 | 0.126 |
| HE | 128.44 | 3D-2P | 6.74E + 10 | 0.167 |
| HE | 128.44 | 3D-2P | 4.04E + 10 | 0.1 |
| HE | 128.44 | 3D-2P | 1.62E + 11 | 0.401 |
| HE | 128.44 | 3D-2P | 1.21E + 11 | 0.3 |
| HE | 128.44 | 3D-2P | 8.99E + 10 | 0.222 |
| HE | 132.79 | 3S-2P | 7.44E + 09 | 0.02 |
| HE | 132.79 | 3S-2P | 1.24E + 10 | 0.033 |
| HE | 135.84 | 3D-2P | 1.53E + 11 | 0.423 |
| HE | 137.55 | 3S-2P | 1.99E + 10 | 0.056 |
| LI | 110.169 | 6D-2P | 6.32E + 09 | 0.012 |
| LI | 110.169 | 6D-2P | 7.58E + 09 | 0.014 |
| LI | 110.21 | 6D-2P | 7.52E + 09 | 0.014 |
| LI | 115.818 | 4P-2S | 1.21E + 10 | 0.024 |
| LI | 115.822 | 4P-2S | 1.21E + 10 | 0.024 |
| LI | 115.822 | 4P-2S | 1.21E + 10 | 0.024 |
| LI | 115.822 | 4P-2S | 1.23E + 10 | 0.025 |
| LI | 115.822 | 4P-2S | 1.21E + 10 | 0.024 |
| LI | 115.827 | 4P-2S | 1.21E + 10 | 0.024 |
| LI | 115.831 | 4P-2S | 1.23E + 10 | 0.025 |
| LI | 115.831 | 4P-2S | 1.21E + 10 | 0.024 |
| LI | 116.334 | 5D-2P | 1.14E + 10 | 0.023 |
| LI | 116.342 | 5D-2P | 1.15E + 10 | 0.023 |
| LI | 116.365 | 5D-2P | 1.15E + 10 | 0.023 |
| LI | 116.365 | 5D-2P | 1.38E + 10 | 0.028 |
| LI | 116.405 | 5D-2P | 1.37E + 10 | 0.028 |
| LI | 116.416 | 5D-2P | 1.38E + 10 | 0.028 |
| LI | 129.754 | 4D-2P | 2.45E + 10 | 0.062 |
| LI | 129.776 | 4D-2P | 2.48E + 10 | 0.063 |
| LI | 129.783 | 4D-2P | 4.93E + 10 | 0.124 |
| LI | 129.812 | 4D-2P | 2.98E + 10 | 0.075 |

TABLE 1-continued

| He-like and LI-like oxygen transitions | | | | |
|---|---|---|---|---|
| ION | WL | TRANS | PROB | F |
| LI | 129.812 | 4D-2P | 2.48E + 10 | 0.063 |
| LI | 129.812 | 4D-2P | 4.96E + 09 | 0.013 |
| LI | 129.84 | 4D-2P | 2.94E + 10 | 0.074 |
| LI | 129.843 | 4D-2P | 4.89E + 09 | 0.012 |
| LI | 129.866 | 4D-2P | 2.98E + 10 | 0.075 |
| LI | 129.869 | 4D-2P | 4.96E + 09 | 0.013 |
| LI | 129.873 | 4D-2P | 2.95E + 10 | 0.075 |
| LI | 129.876 | 4D-2P | 4.92E + 09 | 0.012 |
| LI | 132.311 | 4S-2P | 4.42E + 09 | 0.012 |
| LI | 132.363 | 4S-2P | 4.36E + 09 | 0.012 |

Line c of FIG. 3 shows the typical reflectivity function of a multilayer EUV mirror operating at 13 nm. As mentioned in the background section, for soft x-ray or EUV projection lithography there is a need for a high repetition-rate laser plasma source that can radiate at a specific wavelength such as 11.7 nm or 13 nm in the EUV part of the spectrum and capable of operating at approximately 1200 Hz. Thus, using ice crystals as a target source fulfills these needs.

FIG. 3 demonstrates that an ice target can provide approximately the same amount of radiation at 11.7 nm and 13 nm that can be effectively reflected by multilayer mirrors tuned to the wavelength of 11.7 nm and 13 nm. It should be noted that the radiation from the conventional target that is outside the reflection curve of the multilayer mirror is absorbed by the mirror. This absorbed energy can give rise to undescribable thermal distortion in the mirror surface and reduction in the reflectivity of the mirror. This points to another inherent advantage of the radiation emitted by the ice target.

Figure 4:
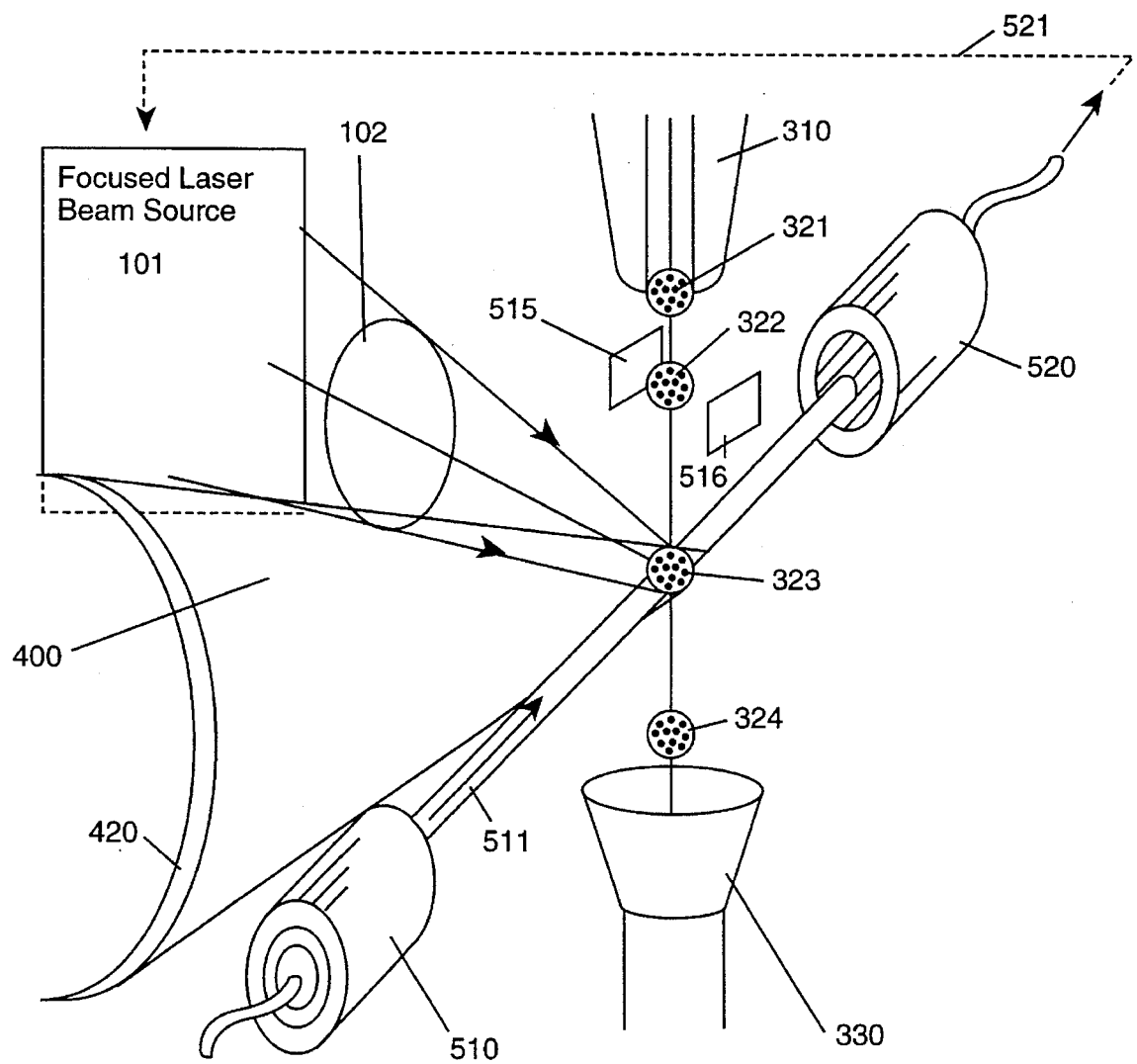
FIG. 4 illustrates a modification for the embodiment of FIG. 2.

FIG. 4 illustrates an auxiliary laser beam particle detection system 510, 511, 515, 516, 520, 521 for use with the embodiment 300 of FIG. 2. Element 102 refers to flashing focussed laser beam. The beam 102 is focussed to intensities on the ice target of $10^{11}$ to $10^{12}$ W/cm$^2$, sufficient to create a plasma having a temperature high enough to ensure the copious production of Li-like oxygen ions. Elements 321 through 324 constitute the path of ice crystal droplets emanating from nozzle jet 310. Elements 515 and 516 refers to an electrostatic guidance system which causes the ice crystals to have an electrostatic charge. The electrostatic guidance system functions. The first function is an electrostatic charging by a device generating an charge or by a device that generates an miniature electron beam that causes the droplet 322 to be charged. The second function of the system 515, 516 is as an array of charged electrodes which provide a variable electric field that can be manipulated to guide the trajectory of the charged droplets 322 to pass through the focus volume 323 of the high power laser beam 102. Electrostatic guidance systems of this type or systems that have these features are commonly incorporated into ink jet systems. Unshot and unused target droplets such as 324 are collected at 330. Element 420 in FIG. 4 is a high NA collector mirror(shown also in FIG. 1) made of high reflective multilayer EUV materials (such as Mo/Si) or some other form of efficient EUV light collector. Mirror 420 collects radiation from the source at 323 and passes the radiation via a second mirror 450 onto the reflection mask 500 as shown in FIG. 1. Items 510 and 520 comprise one embodiment of a particle detection system which verifies that the injected frozen droplet is in the focus of the laser beam, and commands the laser to fire. This detection system utilizes a continuous beam 511 from a low power laser 510 that is focussed through the focus volume of the high power pulsed laser beam 102. A photo detector 520 detects this continuous signal and the moment in time when a droplet 323 passing through the high power laser beam focuses and obscures the continuous laser beam 511. In operation, the detection of the electrostatic charged ice droplets 323 by particle flight detector 520 will trigger the instantaneous firing of laser 101 to flash beam 102 at ice crystal target 323 which in turn produces X-rays 400. The remaining components work in the same manner and operation as FIG. 2.

Figure 5:
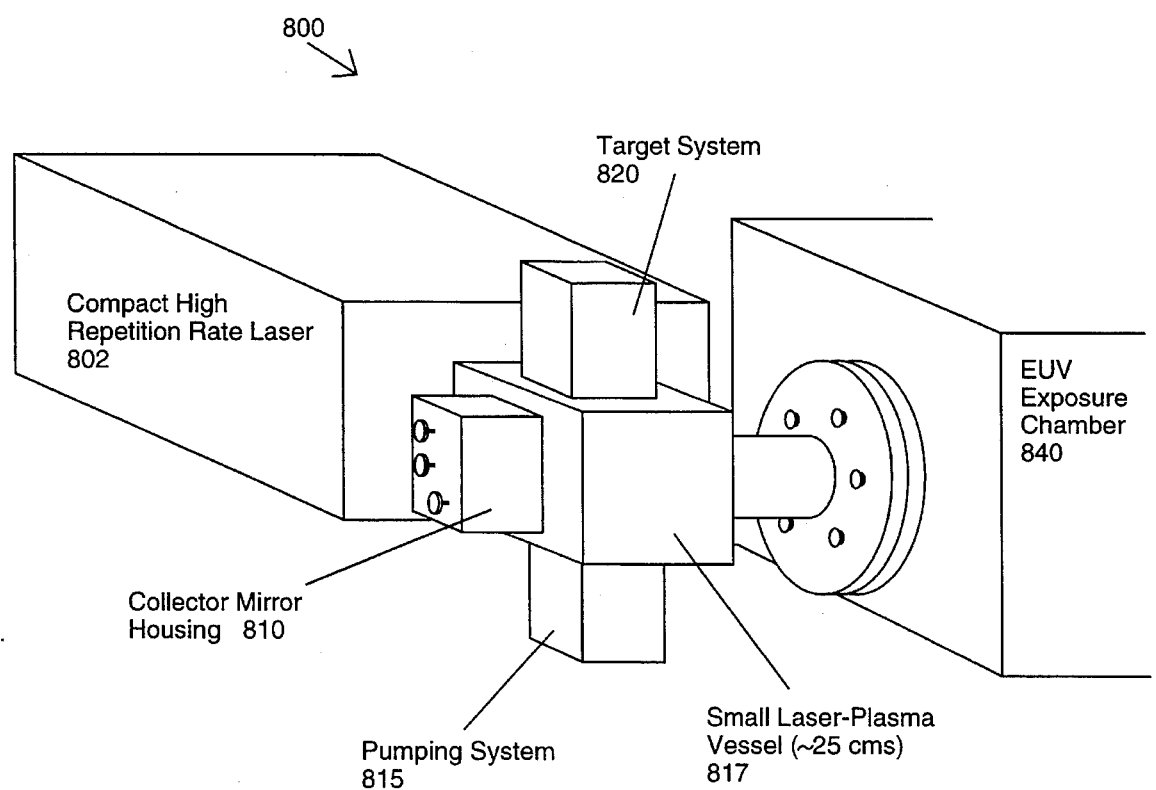
FIG. 5 shows exterior containers used for housing the components of FIG. 1.

FIG. 5 shows exterior system 800 used for housing the components of FIG. 1. The compact high repetition rate laser source 101 can be housed within box 802. The exterior dimensions of the entire system 800 can fit into a space of approximately 1 m×0.5 m×0.5 m. The total weight of all the components 800 is approximately 50 kgms excluding electric power supplies and cooling systems. The collector mirrors 420 and 450 depicted in FIG. 1 can be housed in collector mirror housing 810 which can be readily removable from the rest of the system for replacement of parts and repairs. Referring to FIG. 5, pumping system 815 can be incorporated into the system 800 to ensure low pressure operation of approximately $1 \times 10^{-3}$ torr or less within the chamber 817 as shown in FIG. 3. Chamber 817 connects all the other components together which allows EUV radiation to be generated. Target system container 820 can house the individual components shown in FIG. 2 EUV exposure vacuum chamber 840 in FIG. 5 can contain reflection mask 500 and collector/imaging optics 600 and wafer 700 of FIG. 1.

While the invention has been described as an x-ray source for x-ray lithography, the invention is not limited to this use. The invention can be used as an x-ray source for x-ray microscopy, x-ray imaging systems, x-ray spectroscopy, x-ray fluorescence absorption spectroscopy, x-ray diffraction, x-ray protein diffraction studies, and x-ray interferometry.

While the preferred embodiment refers to collecting unshot and unused crystal targets for recycling, optionally the unused droplet targets can be vaporized additionally by laser beams, microwaves or infrared radiation. Alternatively, the unshot droplets can be captured and vaporized by a heated surface.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of producing 11.7 nm x-rays from a target source comprising the steps of:
    freezing water particles into ice crystals;
    continuously feeding the frozen water particles into a target source;
    irradiating the target source with a laser; producing x-rays of approximately 11.7 nm from the laser erradiated target source; and
    collecting residual ice water particles in a vacuum.

2. The method of producing 11.7 nm x-rays of claim 1, wherein the step of feeding further includes;
    projecting the frozen particles through a high repetition rate liquid-droplet injector.

3. The method of producing 11.7 nm x-rays of claim 1, wherein the step of producing further includes;
    producing x-rays of approximately 13 nm.

4. The method of producing 11.7 nm x-rays of claim 1, wherein the step of feeding the target source further includes;
    continuously feeding the target source at a frequency of approximately 1000 Hz.

5. The method of producing 11.7 nm x-rays of claim 1, wherein the step of feeding the target source further includes;
    continuously feeding the target source in a noninterfering shot sequence approaching $2 \times 10^7$ targets.

6. The method of producing 11.7 nm x-rays of claim 1, wherein the step of feeding the target source further includes;
    continuously feeding the target source in a noninterfering shot sequence exceeding $2 \times 10^7$ targets.

7. The method of producing x-rays of claim 1, further comprising the step of:
    recycling the collected residual ice water particles.

8. A method of producing 11.7 nm and 13 nm x-rays comprising the steps of:
    forming ice crystals;
    projecting the ice crystals through a high repetition rate liquid-droplet injector;
    irradiating the ice crystals with a light source; and
    producing 11.7 nm and 13 nm x-rays from the irradiated ice crystals.

9. The method of producing 11.7 nm and 13 nm x-rays of claim 8, where the light source is:
    a laser.

10. The method of producing 11.7 nm and 13 nm x-rays of claim 8, further comprising the steps of:
    collecting the residual ice crystals in a vacuum;
    reliquifying the collected residual ice crystals into liquid; and
    recycling the reliquified liquid.

11. An apparatus for producing 11.7 nm x-rays comprising:
    a supply of water;
    means for freezing the water into crystals;
    a high repetition rate liquid-droplet injector for feeding the crystals into a target path;
    means for irradiating a laser beam into the target path creating 11.7 nm x-rays; and
    means for collecting residual crystals.

12. The apparatus for producing x-rays of claim 11, wherein the x-rays:
    have an approximate wavelength of 11.7 nm and 13 nm.

13. The apparatus for producing x-rays of claim 11, wherein the means for collecting includes:
    a vacuum collector for absorbing the residual ice crystals.

14. The apparatus for producing x-rays of claim 13, further comprising:
    a heater system for liquifying the residual ice crystals into reliquified targets; and
    a recycle tube for passing the reliquified targets to the supply of water for reuse.

* * * * *